United States Patent
Turvey

(10) Patent No.: US 6,874,058 B1
(45) Date of Patent: Mar. 29, 2005

(54) CONTENT ADDRESSED MEMORIES

(76) Inventor: Douglas Philip Turvey, 34 Meadrow, Godalming, Surrey (GB), GU7 3HT ( * ) Notice: Subject to any disclaimer, the term of this patent is extended or adjusted under 35 U.S.C. 154(b) by 0 days.

(21) Appl. No.: 09/743,713
(22) PCT Filed: Jul. 15, 1999
(86) PCT No.: PCT/GB99/02288
§ 371 (c)(1),
(2), (4) Date: May 7, 2001
(87) PCT Pub. No.: WO00/04553
PCT Pub. Date: Jan. 27, 2000

(30) Foreign Application Priority Data

Jul. 16, 1998 (GB) .............................. 9815370

(51) Int. Cl.[7] ............................................ G06F 12/00
(52) U.S. Cl. ..................... 711/108; 711/128; 365/49; 365/230.01; 365/230.04; 365/230.09
(58) Field of Search ............................... 711/108, 128, 711/136; 365/49, 230.01, 230.04, 230.09

(56) References Cited

U.S. PATENT DOCUMENTS

| | | | | |
|---|---|---|---|---|
| 4,065,756 A | * | 12/1977 | Panigrahi ..................... | 365/49 |
| 4,559,618 A | * | 12/1985 | Houseman et al. ........... | 365/49 |
| 5,226,009 A | * | 7/1993 | Arimoto ................. | 365/189.04 |
| 5,257,220 A | | 10/1993 | Shin et al. ..................... | 365/49 |
| 5,422,838 A | * | 6/1995 | Lin .............................. | 365/49 |
| 5,428,565 A | * | 6/1995 | Shaw .......................... | 365/49 |
| 5,440,709 A | * | 8/1995 | Edgar ............................ | 711/1 |
| 5,440,715 A | * | 8/1995 | Wyland ...................... | 711/108 |
| 5,568,415 A | * | 10/1996 | McLellan et al. ............. | 365/49 |
| 5,777,608 A | * | 7/1998 | Lipovski et al. ............. | 345/519 |

FOREIGN PATENT DOCUMENTS

EP          A-459703          12/1991

* cited by examiner

Primary Examiner—Nasser Moazzami
Assistant Examiner—Ngoc Dinh
(74) Attorney, Agent, or Firm—Lowe Hauptman & Berner, LLP

(57) ABSTRACT

A content addressable memory comprises a CAM control logic unit and plural cells connected in a chain. Each cell comprises a memory block coupled to a common address bus, a comparator coupled to a common data bus and to the data interface of the memory block. A switch couples the data interface of the memory block with the data bus, and a logic block including a Match flip-flop. The memory is operable in a Search phase and an Access phase. In the Search phase, a sequence of words on the common data bus is serially matched with the contents of a sequence of addresses in the memory blocks. In the Access phase, the cells matched in the Search phase are made serially available for access via common address and data buses.

15 Claims, 1 Drawing Sheet

CONTENT ADDRESSED MEMORIES

FIELD OF INVENTION

The present invention relates to memories of the type known as CAMs (Content Addressed Memories) or Associative Memories.

BACKGROUND ART

A conventional computer memory consists of a large number of memory locations which have sequential addresses. To access a location in such a memory, an address is supplied to the memory; the corresponding location is thereby selected, and its contents can then be accesses (is read or written).

This works admirably when the address of the desired location (which typically stores a byte or a word) is known. However, there is a variety of situations in which data is organized in data blocks and what is wanted is a data block having particular data in a part of the block. Conventionally, the only way of finding the desired data block is to search through the data blocks one by one. A simple sequential search is the simplest procedure, but is liable to be extremely time-consuming. Various forms of directory structures or indexing can sometimes by used, but these tend to be complicated and inflexible.

To overcome these problems, a type of memory known as content addressable memory (CAM) has been proposed. This type of memory is also known as associative, because it automatically associates the desired data with the blocks containing that data.

CAMs have never achieved substantial commercial success, primarily because of the complexity of the circuitry required, compared with conventional memories. The situation is made worse because of the relatively limited range of applications for CAMs, so that CAM memories would be a relatively low-volume and high cost product even apart from the extra complexity.

The general object of the present invention is to provide an improved CAM architecture which alleviates or overcomes these problems.

SUMMARY OF THE INVENTION

According to the present invention there is provided a content addressable memory comprising a CAM control logic unit and a plurality of cells connected in a chain, each cell comprising:
  a memory block coupled to a common address bus, a comparator coupled to a common data bus and to the data interface of the memory block;
  switching means coupling the data interface of the memory block with the data bus, and;
  a logic block including a Match flip-flop:
the memory being operable:
  in a Search phase to serially match a sequence of words on the common data bus with the contents of a sequence of addresses in the memory blocks of the cells; and
  in an Access phase, to render the cells matched in the Search phase serially available for access via the common address and data buses.

A CAM embodying the invention will now be described, by way of example, with reference to the drawings.

DETAILED DESCRIPTION OF THE DRAWING

Figure 1:
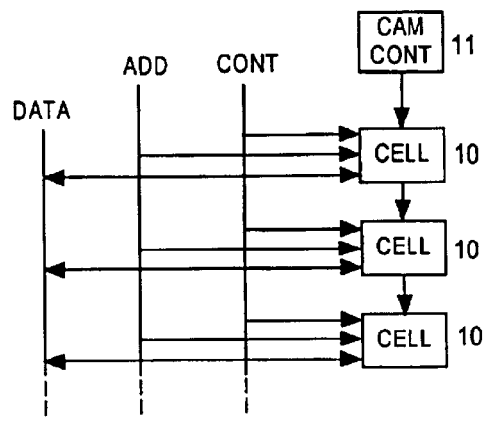
FIG. 1 is a general block diagram of the system.

Referring to FIG. 1, the CAM consists primarily of a chain of identical cells 10, with a CAM control unit 11, which is coupled to the top of the chain of logic blocks 10.

Figure 2:
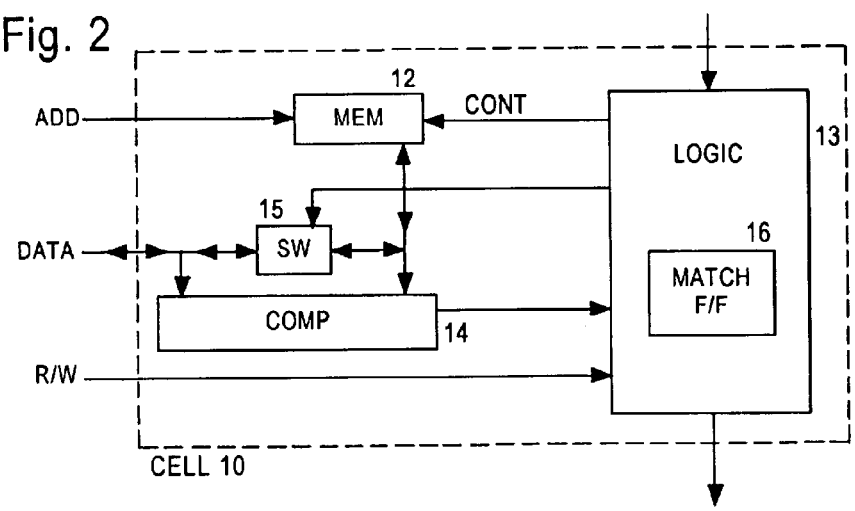
FIG. 2 is a more detailed block diagram of a cell of the system.

Each cell (FIG. 2) contains a respective memory block 12, which may use say DRAM (with conventional refresh arrangements operating on each block) or SRAM. The size of each memory block may be say 64 kbytes, though obviously the number of locations may vary and the word length may also be varied (eg to 2 or 4 bytes). The number of blocks will normally be large, typically of the order of $10^5$.

The cells 10 are coupled to a 1-byte data bus DATA, a 16-bit address bus ADD, and a control bus CONT., the address and data bus widths match the number of locations in the memory block in each cell and the size of each location. If the CAM forms parts of a computer system, these buses may be general systemwide buses, or parts of such system buses. A system address bus may be considerably wider than 16 bits; the bottom 16 bits will then be used as the address bus ADD for the CAM. Similarly, the control bus for the CAM may form part of a multi-bit system control bus.

Each cell 10 also contains a memory block 12, a logic block 13, a comparator 14, and a bidirectional switch 15. The chaining of the cells 10 is through their logic blocks 13, as shown.

The CAM will normally be implemented on an integrated circuit chip. It will be realized that such a chip can easily be designed so that several such chips can be chained to increase the size of the CAM. The control unit 11 is preferably a separate unit. However, it can be included on the CAM chip if desired; in that case, several chips can be chained by designing the controller so that only that of the first chip in the chain is enabled, with those of the following chips in the chain being disabled.

The functions of the logic blocks 13 can best be understood by considering the manner in which the CAM operates. The CAM operates in 2 modes, Search and Access. The Search phase is concerned with finding the cells containing data which matches the search criteria; the Access phase is concerned with accessing those cells to extract the associated data.

For simplicity we shall assume that each cell contains a single data block of 1024 bytes stored in its memory block. If the data block is shorter than 1024 bytes, then it is simply padded out with dummy bytes. (In fact, the dummy bytes may simply be left unused, ie never read or written, in the memory block.) The data blocks also all have the same structure, which we shall take as consisting of a number of key fields Key1, Key2, Key3, etc and a number of data fields Data1, Data2, Data3, etc. Although the division of the data blocks into fields is identical for all data blocks, the number of fields, their sizes, and their locations in the data block can be chosen arbitrarily. We shall also assume that all fields are integral numbers of bytes long.

For a search, a set of key fields is defined, together with a set of search contents for those fields. Each search field is fed to the cells in turn, and for each search field, the search bytes are fed to the cells sequentially. Thus each cell receives a sequence of search bytes on the DATA bus, each accompanied on the ADD bus by its address in the data block. Further, the CAM control unit 11 feeds a Search control signal to all cells, via the chain of logic blocks 13 in the cells.

Each time a byte address is fed to a cell in the Search phase, the corresponding location in the cell's memory block 12 is read. This reads out a byte from one of the key fields in the data block stored in the cell. The stored byte is passed to the compare unit 14, which is also fed with the search byte on the data bus DATA. (Switch 15 is disabled at this time, isolating the DATA bus from the data output of the memory block.) The compare unit 14 compares the 2 bytes fed to it, and produces a Hit or Miss signal, depending on whether the search byte and the stored byte match or don't match.

The logic block 13 of each cell contains a Match flip-flop. The CAM control unit 11 initially sets the Match flip-flops of all cells to the Hit state. In each cell, each time a comparison is made by the comparator 14 between a search byte and a stored key-field byte, the result (Hit or Miss) is fed to the Match flip-flop 16. If the stored byte and the data byte don't match, the Miss output from the comparator clears this flip-flop to Miss. After the succession of search bytes in the different key fields has been run, the Match flip-flop will remain in the Hit state only if all bytes match.

If desired, a MASK bus (not shown), with the same width as the DATA bus, can be included. Masking can time-share the DATA bus or use a second byte on the system data bus if that bus is wide enough. The MASK bus will be coupled to the comparators in all cells 10, and each bit on the MASK bus will determine whether or not the comparator compares the corresponding bits of the search and stored bytes. Thus bit-level rather than merely byte-level searching and matching can easily be implemented if desired. This allows tighter packing of the key fields if many of them are less than 1 byte long.

At the end of the Search phase, therefore, the Match flip-flop of each cell of the CAM will still be in the Hit state if a full match has been achieved for that cell, but will have been set to Miss if any failure of the matching has occurred for that cell.

Once the Search phase is finished, the Access phase follows. For this, the CAM control unit 11 sends an ACCESS signal to the chain. At the start of this phase, there will be some unknown number of cells with their Match flip-flops still set at Hit. These are coupled in a logic chain through the logic blocks 13. The topmost of these cells is enabled by the Access signal and its Match flip-flop, this enabled cell disables all the following cells in the chain.

This enabled cell can be accessed over the address, data and control buses ADD, DATA, and CONT. The address bus is coupled to the memory block 12 of the cell, and the switch 15 is enabled by the logic block 13, coupling the data bus to the memory block data path. The control bus carries a 1-bit read/write signal R/W which is, in this phase, passed through the logic block 13 to the memory block 12, to control whether reading or writing occurs. An arbitrary number of data fields can therefore be read or written, by sending the addresses of those fields to the cells in turn, and for each data field, sending the data bytes to the cells or reading them from the cells sequentially.

Once the accessing of the enabled cell is complete, the CAM control unit 11 sends a signal down the chain of cells to clear the topmost Match flip-flop to Miss. The next Match flip-flop at Hit will then enable its cell, and the data block in that cell can then be accessed. The process continued in the same way with each cell in the chain with its Match flip-flop set being enabled in turn, until all matching data blocks have been accessed.

Obviously not all data blocks found in the Search phase need be accessed in the same way. Once accessing of a block has started, the accessing may if desired be made dependent on data read from the block.

The number of matches (if any) is in general not predictable. A return line may be provided from the end of the chain of cells back to the CAM control unit 11, and arranged to change state when all Match flip-flops in the chain have been cleared to Miss.

Alternatively, the end of the sequence can be determined by software. When the end of the sequence of matching blocks is reached, any attempt to carry on reading data blocks will result in no read occurring. The data bus will therefore return its inactive state (hex=FF if it has pull-up resistors). So to determine when all matching blocks have been read, the system monitors for this data byte. To prevent genuine data bytes with the value hex=FF from being misinterpreted as the end of the set of matching blocks, a standard byte address is chosen in all data blocks and a non-FF-hex byte is deliberately included in that address in every data block.

Once a cell has been selected, it can of course be written as well as read. So a selected cell can simply have a complete new data block written into it, or its contents can be inspected and various parts of it changed, possibly in dependence on what I contains.

It has been assumed above that each cell contains a single data block. The optimum operating condition will be with a data block size which matches the memory block size. A data block must be confined within a single cell, so if the data blocks vary in size, the maximum size must not be larger than the cell size. However, if the data block size is considerably smaller than the cell size, it would be possible to pack 2 (or more) short data blocks into a cell. The division of the cell into such data blocks would be essentially a matter for software control. This would of course mean that a search would have to be done in 2 stages, searching first say the top halves of the cells for data block matches, and then the second halves of the cells for any further data block matches.

It is also possible for two or more data blocks to be linked together into an extended data block by suitable software techniques, so that a set of blocks so linked can be accessed as a group. A set of blocks so linked can be regarded as an extended data block whose size is not limited by the cell size. For example, each extended block can be given a unique identifier, with all cells in the block containing identical copies of the key fields and the block identifier, and each cell of the extended block containing a serial number for its position in the extended block.

Summarizing the system, therefore, it is evident that cells can be searched on any fields, and any cells matching the search can be read, modified, or completely rewritten. Although the operation was described above in terms of key and data fields, the division of the data block structure into such fields is purely notional; any bytes can be treated as key bytes, data bytes, or both.

It is not possible to access a cell by its position in the chain. However, this does not mean that a cell can become inaccessible. If a cell is to be effectively cleared, a standard byte address can be chosen for all data blocks, and filled with one data value if the data block in that cell is valid and another data value if the data block in the cell is cleared is invalid. A search for cells with the second data value in that location will then retrieve all empty data blocks in sequence. If all else fails, a search with no search fields will select all cells, which can then be written into sequentially. (That is, the Search phase is entered to set all Match flip-flops to Hit, and the Access phase is then entered immediately.)

Figure 3:
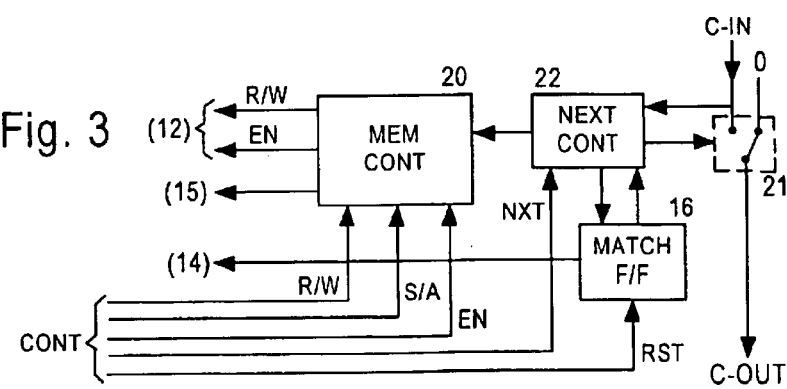
FIG. 3 is a detailed block diagram of the logic block of a cell of the system.

Referring now to FIG. 3, the logic and control circuitry of the cell 10 will be described in more detail. Each cell is, as described above, coupled to the system data bus DATA and the system address bus ADD. There is also a single line chaining all the cells together. Apart from this single line, the control signals to the cells are preferably all carried on the system control bus CONT, which is coupled to all cells. In many instances, the system CPU can conveniently be arranged to generate these signals, so that this CPU constitutes the CAM control unit 11. In addition, a further line of the control bus may be coupled to the first cell as the start of the chain line through all cells. (As discussed above, a return line from the end of the chain line may usually be dispensed with.)

FIG. 3 shows the control logic unit 13 of a typical cell 10 in more detail. A memory control unit 20 is fed with three control bus signals R/W, S/A and EN. The R/W signal is a read/write signal, which is used to determine whether the cell memory block 12 is to be read from or written to in the access phase of the operation of the CAM. The S/A signal determines whether the CAM operates in the Search or Access modes. The EN signal is an enable signal, which determines whether the CAM is enabled or not. When enabled, it is assumed that the other devices coupled to the system buses are disabled; when the CAM is disabled, other devices coupled to the system buses may be enabled without their operation being affected by the existence of the CAM.

It will be realized, of course, that the CAM (or the integrated circuit chips carrying the CAM) may be assigned a control address, so that the CAM can be enabled and disabled by means of such a control address. In effect, this means that the CAM is enabled by a suitable signal combination (the control address) on a plurality of control bus lines, but that set of control bus lines will be shared with many other devices in the system, rather than the CAM requiring a dedicated control bus line.

The memory logic block 20 generates three output signals. There is a control signal to the bidirectional switch 15, which is used to couple the memory block 12 and the data bus DATA to the comparator 14 in the search phase and the memory block to the data bus in the access phase. There is a R/W signal to the memory block 12 to set it for reading in the search phase and for reading or writing, as the case may be, in the access phase. And there is an Enable signal to the memory block 12, to enable it in the search phase and, if the cell is the selected cell, in the access phase.

The cell also includes a chain line coupling switch 21 which couples the chain line into the cell, C-IN, to the chain line out of the cell, C-OUT. This switch in effect either couples the chain in line C-IN to the chain out line C-OUT or imposes a logic 0 on the chain out line C-OUT. It can conveniently be implemented as a pair of switches, one connected between the chain in and chain out lines and the other connecting the chain out line to earth (logic 0), with a control signal driving one switch directly and the other via an inverter. If desired, the cells may be grouped into groups with more elaborate logic for the chain line within the groups to reduce signal propagation time along the chain.

The control logic unit 13 also includes the match flip-flop 16, which has already been discussed. This flip-flop has an input from the comparator 14, as described above. It is also fed with a further signal RST from the system control bus CONT. This signal RST is a reset signal which is used to reset all match flip-flops in the CAM to the match state at the beginning of the search phase.

Finally, there is a Next control block 22. This is fed from the match flip-flop 16 and from the chain in line C-IN and controls the chain line switch 21, if the signal on the chain in line is a logic 1 (which indicates that all cells above the present cell in the chain have been dealth with), and if the match flip-flop remains set at the end of the search phase, then the present cell is the next one to be accessed. The Next control block 22 enables the memory control block 20, and sets the switch 21 to logic 0. If the match flip-flop has been cleared, however, then the Next control block automatically disables the memory control block 20 (so that the cell cannot be accessed) and sets the switch 21 to pass the signal on the chain in line on to the chain out line.

The Next control block is also fed with the fifth of the five signals from the system control bus, NXT, and further includes a flip-flop. If the cell is the currently selected one (ie the match flip-flop is still at match and all cells above it in the chain have been accessed), then the NXT signal effectively disables the present cell. The Next control block 21 sets the switch 21 to pass the logic 1 on to the next cell down the chain, and disables the memory control logic 20 so that the cell cannot be accessed again. The flip-flop of the Next control block is used to capture the state of the incoming C-IN signal and prevent the NXT signal from propagating down the chain. The Next control block therefore also has an output to the match flip-flop 16.

What is claimed is:

1. A content addressable memory comprising a CAM control logic unit and a plurality of cells connected in a chain, the cells being serially connected, each of the cells including:

a memory block;

a data interface and a plurality of addresses arranged to be sequentially addressed through the data interface, the plurality of addresses being coupled to a common address bus;

a comparator coupled to a common data bus and to the data interface of the memory block;

a switch for coupling the data interface of the memory block with the data bus; and a logic block including a Match flip-flop;

the memory being operable arranged to have a search phase and an access phase so that:

(a) in the search phase, a sequence of words on the common data bus is matched with the contents of a sequence of addresses in the memory blocks of the cells; and (b) in the access phase, causing the cells matched in the search phase to be serially available for access via the common address and data buses, said access phase occurring subsequent to said search phase;

the logic block being arranged for cumulatively storing the results of the serial matching during the memory search phase as the matching proceeds.

2. A content addressable memory according to claim 1 wherein each cell includes a memory block, a logic block, a comparator, and a bidirectional switch.

3. A content addressable memory according to claim 1 wherein an integrated circuit chip carries the CAM and plural cells.

4. A content addressable memory according to claim 3 wherein several of the chips are chained.

5. A content addressable memory according to claim 4 wherein each chip includes a control unit which can be disabled.

6. A content addressable memory according to claim 1 including a MASK bus input for determining which bits of the words of the sequence of words are used for matching in the Search phase.

7. A content addressable memory according to claim 1 including a return line from the end of the chain of cells back to the CAM control unit for changing state in response to all Match flip-flops in the chain having been accessed.

8. A method of operating a content addressable memory according to claim 1 comprising the steps of choosing a standard byte address in all data blocks and including a byte different from an inactive state of the data bus in that address in every data block.

9. A method of operating a content addressable memory according to claim 1 wherein each cell is divided into a plurality of distinct data blocks.

10. A method of operating a content addressable memory according to claim 1 wherein a plurality of cells are combined into an extended data block with all cells of the block including corresponding key fields.

11. A method of operating a content addressable memory according to claim 1 further including choosing a standard byte address in all data blocks and filling the data blocks with one data value if the data block in that cell is valid and another data value if the data block in the cell is cleared.

12. A method of operating a content-addressable memory having a search phase and an access phase, the memory including a CAM control logic unit and a plurality of cells connected in a chain, the cells being serially connected, each of the cells including a memory block comprising a data interface and a plurality of addresses sequentially addressable through the data interface and coupled to a common address bus, the method comprising:

(a) serially matching, during the search phase, a sequence of words on a common data bus with the contents of a sequence of addresses in the memory blocks of the cells;

(b) cumulatively storing the results of the serial matching of step (a) as the matching proceeds; and (c) causing, during the access phase, the cells matched in the search phase to be serially available for access via the common address and data buses, said access phase occurring subsequent to said search phase.

13. The method of claim 12, further including determining which bits of the words of the sequence of words are used for matching in the search phase.

14. The method of claim 12, comprising the steps of choosing a standard byte address in all data blocks and including a byte different from an inactive state of the data bus in that address in every data block.

15. The method of claim 12, further including choosing a standard byte address in all data blocks and filling the data blocks with one data value if the data block in that cell is valid and another data value if the data block in the cell is cleared.

* * * * *